(12) United States Patent
Jang

(10) Patent No.: US 7,956,422 B2
(45) Date of Patent: Jun. 7, 2011

(54) SEMICONDUCTOR DEVICE, METHOD FOR FABRICATING THE SAME, AND TRANSFORMER CIRCUIT USING THE SAME

(75) Inventor: Byung Tak Jang, Seongnam-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 277 days.

(21) Appl. No.: 12/234,515

(22) Filed: Sep. 19, 2008

(65) Prior Publication Data

US 2009/0085541 A1 Apr. 2, 2009

(30) Foreign Application Priority Data

Sep. 28, 2007 (KR) .................. 10-2007-0097887

(51) Int. Cl.
*H01L 27/092* (2006.01)
(52) U.S. Cl. ........ 257/371; 257/330; 257/355; 323/282; 323/283
(58) Field of Classification Search .......... 323/282, 323/283; 257/334, 330, 355, 371
See application file for complete search history.

(56) References Cited

U.S. PATENT DOCUMENTS

| | | | | |
|---|---|---|---|---|
| 2006/0006432 A1* | 1/2006 | Shiraishi et al. | ............. | 257/288 |
| 2009/0015228 A1* | 1/2009 | Sato et al. | .................. | 323/283 |

FOREIGN PATENT DOCUMENTS

JP 2006-93184 A 4/2006

OTHER PUBLICATIONS

Naohiko Morota; "Semiconductor Device and Switching Power Supply Device Using the Same", Patent Abstracts of Japan; Publication No. 2006-093184; Publication Date: Jun. 4, 2006; Japan Patent Office, Japan.

* cited by examiner

*Primary Examiner* — Tan N Tran
(74) *Attorney, Agent, or Firm* — The Law Offices of Andrew D. Fortney; Andrew D. Fortney

(57) ABSTRACT

A semiconductor device, a method for fabricating the same, and a transformer circuit using the same are disclosed. The semiconductor device includes a trench metal oxide semiconductor (MOS) transistor for switching a load of current supplied from a power source, and a boost controller for controlling driving of the trench MOS transistor, the boost controller being formed with the trench MOS transistor on a single semiconductor device to form an integrated structure. In this structure, the physical space of the semiconductor device is reduced, thereby reducing the size of a DC-DC transformer circuit using the semiconductor device. It is possible to obtain finely-adjusted output values by controlling values of the ripple current and ripple voltage. A desired operational stability according to a variation in temperature can also be secured.

20 Claims, 14 Drawing Sheets

SEMICONDUCTOR DEVICE, METHOD FOR FABRICATING THE SAME, AND TRANSFORMER CIRCUIT USING THE SAME

This application claims the benefit of the Korean Patent Application No. 10-2007-0097887, filed on 28 Sep. 2008, which is hereby incorporated by reference as if fully set forth herein.

BACKGROUND OF THE INVENTION

1. Field of the Invention

The present invention relates to a semiconductor device, a method for fabricating the same, and a transformer circuit using the same, and more particularly, to a semiconductor device capable of achieving an enhancement in fabrication efficiency, a reduction in fabrication costs, and an enhancement in operation reliability, a method for fabricating such a semiconductor device, and a transformer circuit using the same.

2. Discussion of the Related Art

A switching mode power supply (SMPS) is used as a DC-stabilizing power source for an electronic communication appliance such as an electronic calculator or an electronic switching system. The SMPS controls a flow of electric power, using the switching process of a semiconductor device. Accordingly, the SMPS has superior advantages in terms of high efficiency, compactness, and lightness, as compared to conventional stabilizing power sources. In this regard, the SMPS is widely used as a stabilizing power source.

It is well known that, in electronic communication appliances, systems have rapidly advanced in terms of compactness and lightness in accordance with the development of semiconductor integrated circuits, but the power source(s) thereof still have limitations on compactness and lightness due to the use of an inductor and a capacitor as passive elements for energy storage. As a result, the compactness and lightness of the SMPS may be relatively more important than the system components for the compactness and lightness of the electronic communication appliance.

The SMPS may be mainly classified into AC-DC types, in which an AC voltage is converted into a DC voltage, and DC-DC types, in which a first DC voltage is converted into a second DC voltage having the same characteristics as the first DC voltage. The SMPS may also be classified into an insulation type and a non-insulation type. The insulation type SMPS may include a buck or step-down type, a boost or step-up type, and a buck-boost type. The insulation type SMPS generally includes a buck-boost type converter (e.g., a flyback converter or a ringing chock converter [RCC]) or a buck type converter (e.g., a forward type converter, a half bridge type converter, a full bridge type converter, or a push-pull type converter). The converter mainly uses a transformer.

The boost type converter is a DC-DC boost converter, which boosts an input DC voltage, and outputs the boosted DC voltage. The DC-DC boost converter controls the switch-on time of a transistor, using a boost controller, and thus controls an output voltage compared to an input voltage.

FIG. 1 is a circuit diagram illustrating a general DC-DC transformer circuit including a boost controller. Referring to FIG. 1, the DC-DC transformer circuit 10 includes a power source 40 for supplying an input voltage for the DC-DC transformer circuit 10, a MOS transistor 30 for switching the load of the current supplied from the power source 40, and an inductor 42 for accumulating or discharging energy supplied from the power source 40 in accordance with the switching operation of the MOS transistor 30. The DC-DC transformer circuit 10 also includes a diode 44 for preventing the current from flowing backwards in the circuit 10, a capacitor 46 for outputting the energy discharged from the inductor 42, and a boost controller 20 for controlling an ON-OFF timing of the MOS transistor 30.

The MOS transistor 30 has a structure corresponding to a field effect transistor (FET) in which a metal or polysilicon gate is isolated from a semiconductor (source/drain). Hereinafter, the MOS transistor 30 will be referred to as a "MOSFET". The MOSFET 30 includes a source, a gate, and a drain, respectively corresponding to an emitter, a base, and a collector in a bipolar transistor or bipolar junction transistor (BJT). In the general DC-DC transformer circuit 10 shown in FIG. 1, the MOSFET 30 is turned on or off by the boost controller 20, to function as a switching element to change the load of the transformer circuit 10.

The boost controller 20 controls the ON-OFF timing of the MOSFET 30, namely, the operation time of the MOSFET 30, using a periodic signal from an oscillator.

In the DC-DC transformer system using the boost controller 20, energy supplied from the power source 40 is accumulated in the inductor (L) 42 when the MOSFET 30, which functions as a switch, is in an ON state. When the MOSFET 30 is subsequently turned off, the energy (current) accumulated in the inductor 42 is discharged to an output stage, namely, the capacitor 46, via the diode 44. In this boost transformer system, the voltage supplied from the power source 40 is outputted at a maximum value from the capacitor 46 when the OFF time of the MOSFET 30 is minimal. As the ON time of the MOSFET 30 is varied, the value of the boosted voltage is adjusted. The boost controller 20 is referred to as a "boost converter" or a "step-up converter" because the boost controller 20 has operation characteristics in which the output voltage has a value generally higher than that of the input voltage.

The general DC-DC transformer circuit 10 has a drawback in that a large space for the circuit configuration thereof is needed because the MOSFET 30 and boost controller 20 are configured by separate integrated circuits, respectively. Since such separate integrated circuits are used, there is also a drawback in that the fabrication time and costs of the DC-DC transformer circuit 10 increase. Furthermore, a large number of elements are combined to fabricate the DC-DC transformer circuit 10. For this reason, there is a drawback in that the reliability of the output voltage is lowered due to a possible malfunction of the elements.

SUMMARY OF THE INVENTION

Accordingly, the present invention is directed to a semiconductor device, a method for fabricating the same, and a transformer circuit using the same that substantially obviate one or more problems due to limitations and disadvantages of the related art.

An object of the present invention is to provide a semiconductor device capable of achieving an enhancement in fabrication efficiency, a reduction in fabrication costs, and an enhancement in operation reliability, a method for fabricating the same, and a transformer circuit using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device may comprise a trench metal oxide semiconductor (MOS) transistor adapted to switch a current load supplied from a power source; and a boost controller adapted to drive the trench MOS transistor, the boost controller and the trench MOS transistor forming an integrated structure on a single semiconductor substrate.

The trench MOS transistor may comprise a heavily-doped $N^+$ type semiconductor substrate; a lightly-doped N type layer in or adjacent to a lightly-doped P type epitaxial layer on the a heavily-doped $N^+$ type semiconductor substrate; a P type well having a predetermined depth in the lightly-doped N type layer; a plurality of gates respectively in a plurality of trenches having a depth of 1 to 2 μm in the lightly-doped N type layer, the trenches extending through the P type well; N type sources each between adjacent gates; a contact layer in contact with the sources; an insulating layer covering the gates; a common drain on a back surface of the heavily-doped $N^+$ type semiconductor substrate; and a device isolation layer adapted to isolate the boost controller and the trench MOS transistor from each other.

The boost controller may comprise a heavily-doped $N^+$ type substrate; a lightly-doped P type epitaxial layer on the heavily-doped $N^+$ type substrate; an N type well and a P type well each having a predetermined depth in the P type epitaxial layer; P and N type gates on an oxide film; source and drain electrodes respectively in regions at sides of the gate in the N type well and at sides of the gate in the P type well; lightly-doped drain (LDD) regions in contact with the source and drain electrodes; and a device isolation layer adapted to isolate the source and drain electrodes in the N type well from the source and drain electrodes in the P type well.

In another aspect of the present invention, a method for fabricating a semiconductor device may comprise implanting a first N-type dopant (e.g., phosphorous) in a portion of a P type epitaxial layer in a semiconductor substrate, thereby forming a lightly-doped N type layer; implanting a second N-type dopant (e.g., phosphorous) in another portion of the P type epitaxial layer, thereby forming an N type well; implanting a first P-type dopant (e.g., boron) in another portion of the P type epitaxial layer and in the N type layer, thereby forming P type wells in each of the P type epitaxial layer and in the N type layer; forming a plurality of trenches extending through the P type well in the N type layer; forming first silicon oxide films on inner walls of the trenches; forming first gates on the silicon oxide films in the trenches; forming a second silicon oxide film on portions of the N and P type wells in the P type epitaxial layer; forming second gates on the second silicon oxide film; forming a P type source and a P type drain in the N type well; forming P type LDD regions in contact with the P type source and the P type drain in the N type well; forming an N type source and an N type drain in the P type well of the P type epitaxial layer; forming N type LDD regions in contact with the N type source and the N type drain in the P type well of the P type epitaxial layer; forming $N^+$ type sources in the P type well formed in the N type layer; forming a $P^+$ type contact layer in contact with the $N^+$ type sources; forming an insulating layer on the first gates; and forming a common drain on a back surface of the semiconductor substrate.

In another aspect of the present invention, a transformer circuit using a semiconductor device may comprise a power source supplying a power and/or current; an inductor adapted to accumulate or discharge current from the power source; a capacitor adapted to store energy from the inductor; a diode adapted to prevent a flow of current from the capacitor to the inductor; and a semiconductor device adapted to control the current from the power source, and the energy accumulated in and/or discharged from the inductor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings.

Figure 1:
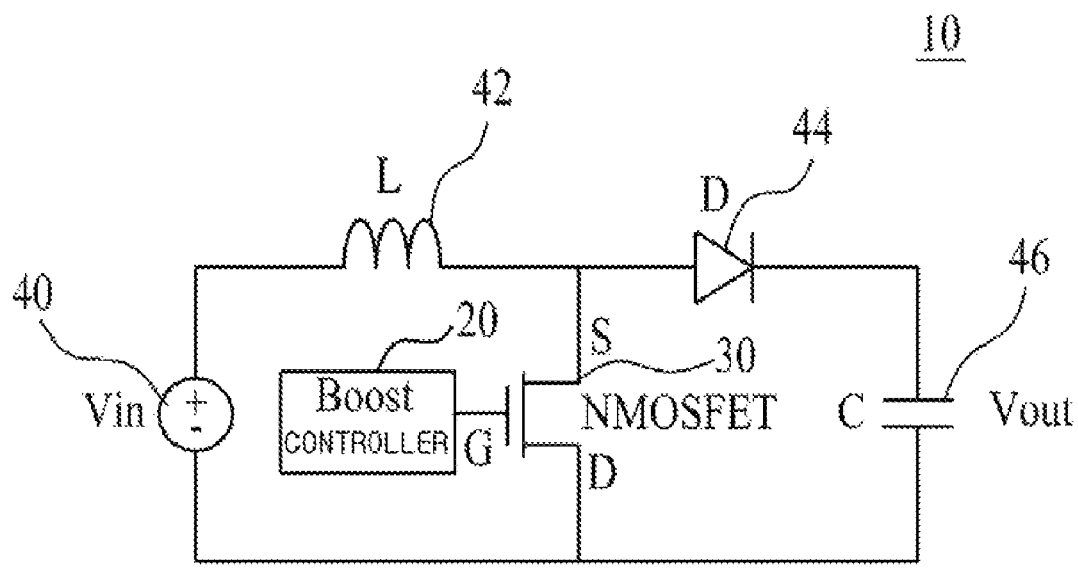
FIG. 1 is a circuit diagram illustrating a general DC-DC transformer circuit including a boost controller.
Figure 2:
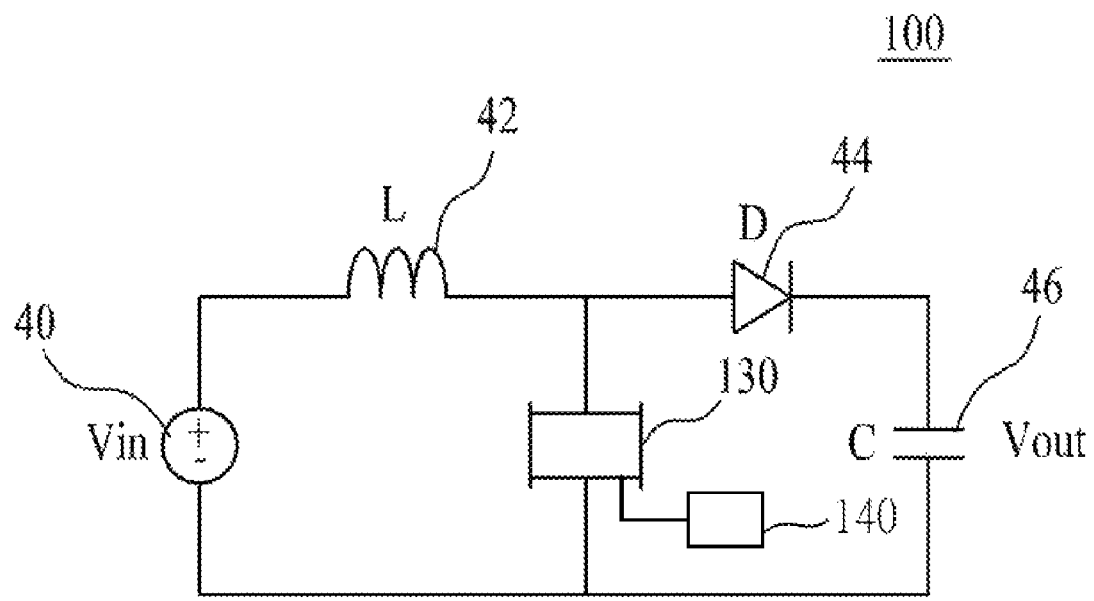
FIG. 2 is a circuit diagram illustrating an exemplary DC-DC transformer circuit using a semiconductor device in accordance with an exemplary embodiment of the present invention.
Figure 3:
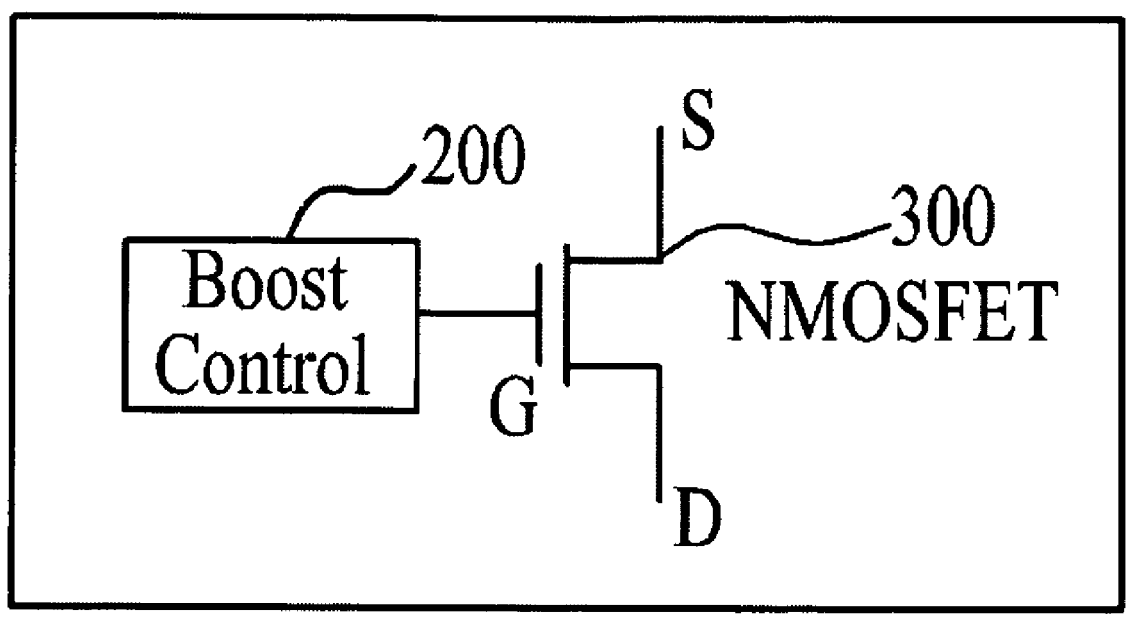
FIG. 3 is a circuit diagram illustrating the semiconductor device according to the exemplary embodiment of the FIG. 2.

FIG. 2 is a circuit diagram illustrating an exemplary DC-DC transformer circuit using a semiconductor device in accordance with an exemplary embodiment of the present invention. FIG. 3 is a circuit diagram illustrating the semiconductor device according to the exemplary embodiment of the present invention.

Referring to FIGS. 2 and 3, the exemplary DC-DC transformer circuit 100 according to the illustrated embodiment of the present invention includes a power source 40 supplying a power and/or current, an inductor 42 adapted to accumulate and/or discharge energy and/or current supplied from the power source 40, a diode 44 adapted or configured to prevent current from flowing backwards in the circuit 100 (e.g., from capacitor 46 to inductor 42), a capacitor 46 to store and/or output the energy (e.g., current and/or power) discharged from the inductor 42, and a semiconductor device 130 for switching the current load supplied from the power source 40. The amount of current load or energy discharged to the capacitor 46 is controlled by an ON-OFF timing (e.g., switching) of the semiconductor device 130.

Although not shown, the DC-DC transformer circuit 100 according to the illustrated embodiment of the present invention may further include a separate temperature sensor 140 for determining an amount of heat generated by or from the semiconductor device 130. Controlling the driving of the semiconductor device 130 (e.g., switching from the semiconductor device 130 on and off) generally is performed by detecting heat generated from the semiconductor device 130. For example, when the amount of heat surpasses a first predetermined threshold (e.g., the sensor detects a temperature of 90° C., 100° C., 120° C. or more), the boost controller may switch the semiconductor device 130 off, and when the amount of heat decreases below a second predetermined threshold (e.g., the sensor detects a decrease in the temperature of 10° C., 20° C., 30° C. or more below the first predetermined threshold temperature), the boost controller may switch the semiconductor device 130 on.

The DC-DC transformer circuit 100 of FIG. 2 according to the illustrated embodiment(s) of the present invention controls the current load supplied from the power source 40 and the energy accumulation time (through the semiconductor device 130) to output a DC voltage having a value equal to or higher than the value of an input DC voltage.

As shown in FIG. 3, the semiconductor device 130 according to the illustrated embodiment of the present invention includes an N type trench MOS transistor (MOSFET) 300 functioning as a switching element, and a boost controller 200 adapted to control the switching operations of the N type trench MOSFET 300. The N type trench MOSFET 300 and boost controller 300 form an integrated structure (e.g., they are on the same semiconductor substrate). That is, the semiconductor device 130 has a structure in which the two different semiconductor devices 200 and 300 are integrated into one chip.

The semiconductor device 130, which has the above-described configuration in accordance with illustrated embodiment(s) of the present invention may operate within a predetermined temperature range, as determined by the temperature sensor 140 in the DC-DC transformer circuit 100 or coupled to the boost controller 200. The temperature sensor 140 senses heat generated from the semiconductor device 130, and cuts off an input power supplied to the semiconductor device 130 when the temperature of the semiconductor device 130 increases to a reference value or more. Thus, the temperature sensor 140 may control the driving and/or switching of the semiconductor device 130. When the semiconductor device 130 operates within the predetermined temperature range under the control of the temperature sensor 140, it is possible to prevent malfunction of the circuit and/or damage to the semiconductor device 130 caused by the high temperature and/or heat generated in or by the device.

Figure 4:
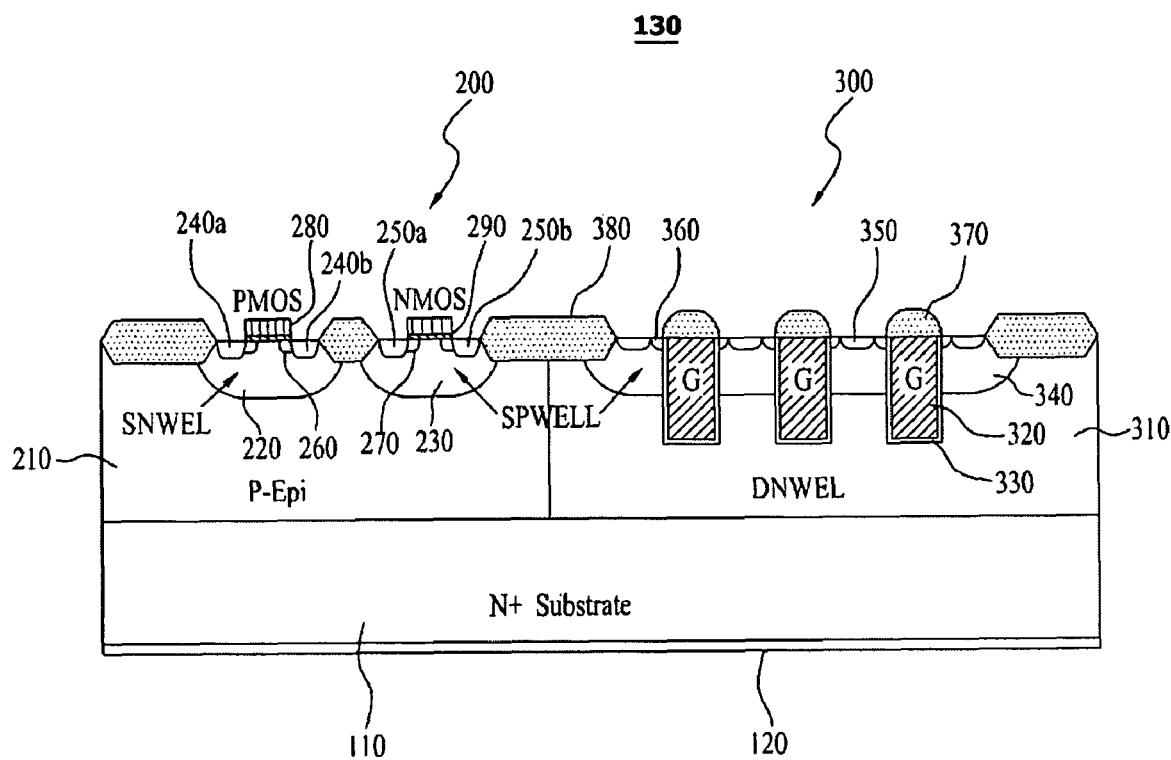
FIG. 4 is a cross-sectional view illustrating an exemplary semiconductor device, which includes a trench metal oxide semiconductor (MOS) transistor and a boost controller in accordance with an illustrated embodiment of the present invention.

FIG. 4 is a sectional view illustrating an exemplary semiconductor device, which includes the trench MOSFET and boost controller in accordance with illustrated embodiment(s) of the present invention.

Referring to FIG. 4, the semiconductor device 130 according to illustrated embodiment(s) of the present invention, as described above, includes the N type trench MOSFET 300 functioning as a switching element, and the boost controller 200 for controlling the switching operations of the N type trench MOSFET 300. The N type trench MOSFET 300 and boost controller 300 are formed on the same substrate such that they form an integrated structure.

The boost controller 200 of the semiconductor device 130 according to the illustrated embodiment(s) of the present invention includes a lightly-doped P type epitaxial layer 210 formed on the silicon substrate 110, and an N type well (SN-well) 220 and a P type well (SP-well) 230 having a certain depth in the P type epitaxial layer 210. The boost controller 200 also includes P type source and drain electrodes 240a and 240b respectively formed in regions at opposed sides of a polysilicon gate in the N type well 220, N type source and drain electrodes 250a and 250b respectively formed in regions at opposite sides of a polysilicon gate in the P type well 230, and lightly-doped drain (LDD) regions 260 and 270 in contact with the source and drain electrodes 240a and 240b of the N type well 220 and the source and drain electrodes 250a and 250b of the P type well 230, respectively. The boost controller 200 performs functions capable of achieving an enhancement in transistor output resistance and a reduction in leakage current (OFF current). The boost controller 200 also includes an oxide film (SiO$_2$) 290 over the channel of the PMOS transistor (e.g., formed between the source and drain electrodes 240a and 240b) on the N type well 220 and over the channel of the NMOS transistor (e.g., between the source and drain electrodes 250a and 250b) on the P type well 230, such that the oxide film 290 overlaps with the N type well 220 and P type well 230. P and N type gates 280 are formed on the oxide film 290, using P type polysilicon (poly-Si) and N type polysilicon, respectively, over the N type well 220 and P type well 230. The semiconductor device 130 also includes a device isolation layer 380 configured and/or adapted to isolate the boost controller 200 from the trench MOSFET 300, which may be subsequently formed. The source and drain electrodes 240a and 240b, gate 280, and oxide film 290 constitute a P type MOS (PMOS) transistor, whereas the source and drain electrodes 250a and 250b, gate 280, and oxide film 290 constitute an N type MOS (NMOS) transistor.

The trench MOS transistor 300 of the semiconductor device 130 according to the illustrated embodiment(s) of the present invention includes a heavily-doped N$^+$ type silicon (Si) substrate 110 (which is generally also used in common with the boost controller 200, for example as a mechanical support and/or P-N junction interface to isolate the boost controller 200 from underlying structures), a lightly-doped N type layer 310 formed by implanting an N type material in a low concentration into the lightly-doped P type epitaxial layer 210 on the silicon substrate 110, and P type well(s) (SP-well) 340 formed to a certain depth in the lightly-doped N type layer 310. The trench MOS transistor 300 also includes a plurality of N type gate electrodes 320 formed (and penetrating the P type well [SP-well] 340) to a certain depth in the lightly-doped N type layer 310, using N type polysilicon (poly-Si), N type source electrodes 360 each formed between adjacent N type gate electrodes 320 (or between an outermost N type gate electrode 320 and isolation structure 380), a contact layer 350 in contact with the N type source electrodes 360, and an insulating layer 370 covering at least part of the N type gate electrodes 320.

In the semiconductor device 130 according to the illustrated embodiment(s) of the present invention, the boost controller 200 is formed at a central portion of the semiconductor device 130, and a plurality of MOS transistors 300 are uniformly arranged around the boost controller 200 such that heat is uniformly generated over the overall area of the semiconductor device 130. For example, in a layout view, MOS transistor 300 and isolation layer 380 may form concentric circles, squares or rectangles around the boost controller 200. By virtue of this heat generation and/or dissipation structure, it is possible to prevent the semiconductor device 130 from being damaged by heat, and to achieve an enhancement in the temperature characteristics of a circuit using the semiconductor device 130.

The polysilicon (poly-Si) used as a material for forming the electrodes of the boost controller 200 and N type MOS transistor 300 corresponds to an intermediate material between single crystal silicon (Si) and amorphous silicon (a-Si). Polysilicon generally has a structure in which fine crystal grains are randomly coupled without necessarily being uniformly arranged. This structure may be different from single-crystal silicon.

In the exemplary semiconductor device 130, the MOS transistor (MOSFET) 300 and boost controller 200 (which may have the above-described configurations) are formed on the same substrate in accordance with illustrated embodiment(s) of the present invention. The MOSFET 300 is switched on and off by the boost controller 200, so that it functions as a switching element for changing the load of the transformer circuit 100. In one embodiment, the boost controller 200 controls the ON-OFF timing of the MOSFET 300 (namely, the operation times of the MOSFET 300) using a periodic signal from an oscillator. Such an oscillator may be internally or externally provided to the boost controller 200.

In the DC-DC transformer system using the boost controller 200, energy supplied from the power source 40 may accumulate in the inductor (L) 42 when the MOSFET 300, which functions as a switch, is in an ON state. When the MOSFET 30 is subsequently turned off, the energy (current) accumulated in the inductor 42 may be discharged to an output stage, namely, the capacitor 46, via the diode 44. In this boost transformer system, the voltage supplied from the power source 40 is output from the capacitor 46 (e.g., the capacitor 46 tends to completely discharge) when the OFF time of the MOSFET 30 is minimal. As the ON time of the MOSFET 30 is varied (e.g., decreased), the value of the boosted voltage is adjusted (e.g., increased).

Hereinafter, the principle of the operations of the exemplary semiconductor device and DC-DC transformer circuit according to the illustrated embodiment(s) of the present invention will be described with reference to the accompanying drawings.

Figure 5:
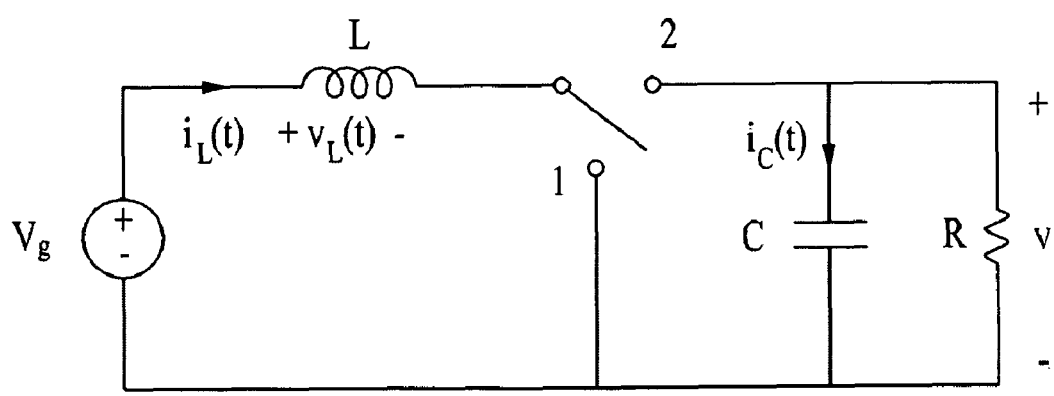
FIG. 5 is a circuit diagram illustrating a switching operation of the boost controller of the exemplary DC-DC transformer circuit according to the illustrated embodiment of FIG. 4.

FIG. 5 is a circuit diagram illustrating switching operations of the exemplary boost controller of the DC-DC transformer circuit according to illustrated embodiment(s) of the present invention.

Figure 6:
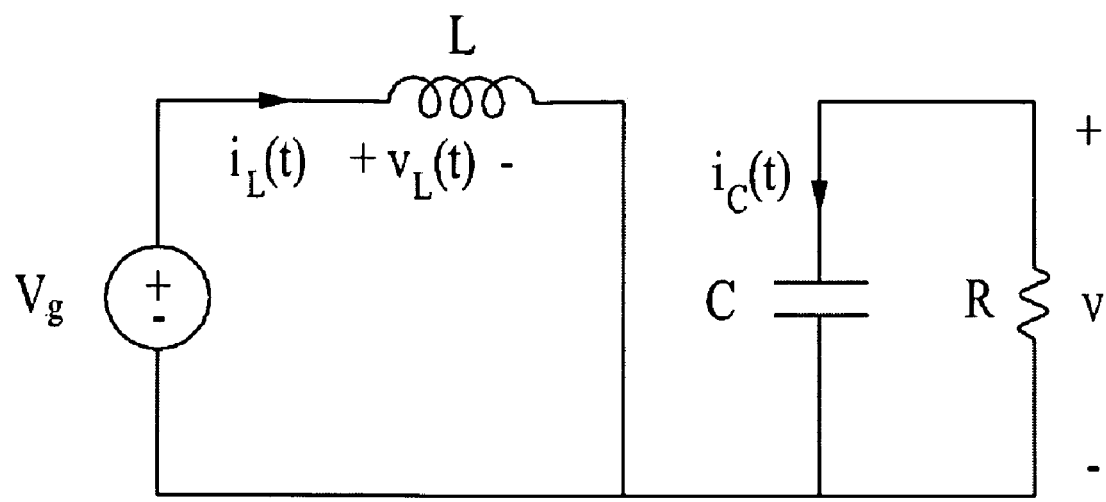
FIG. 6 is a circuit diagram illustrating an exemplary load of the DC-DC transformer circuit in an ON state of the boost controller.
Figure 7:
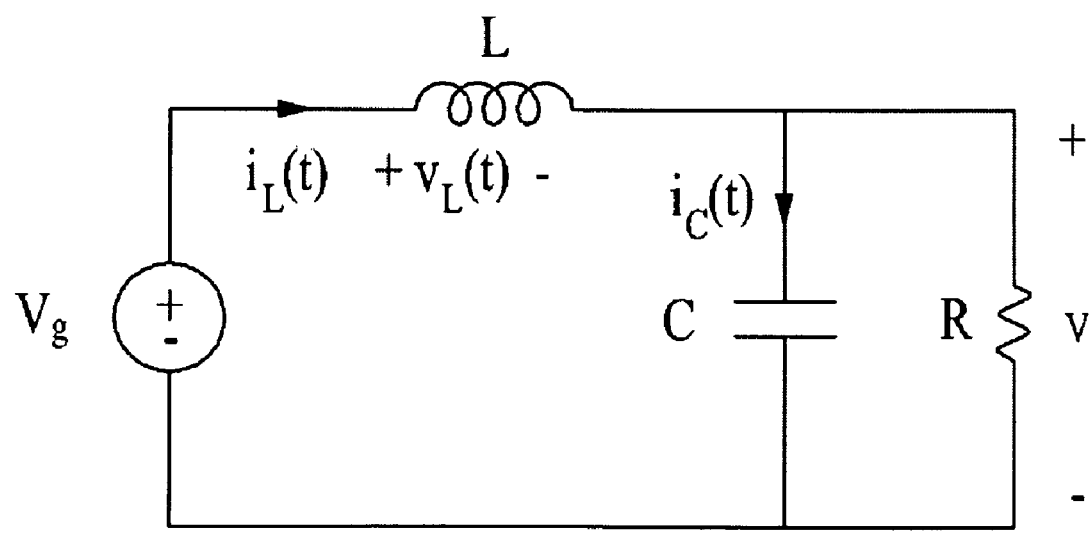
FIG. 7 is a circuit diagram illustrating an exemplary load of the DC-DC transformer circuit in an OFF state of the boost controller.

Referring to FIG. 5 together with FIG. 2, the DC-DC transformer circuit 100 according to the illustrated embodiment(s) of the present invention forms a load of "1" or "2" in accordance with switching operations of the semiconductor device 130. For example, when a gate-ON signal from the boost controller 200 of the semiconductor device 130 is applied to the gate electrode of the MOSFET 300, the MOSFET 300 is turned on, so that a load of "1" is formed, as shown in FIG. 6. In other words, when the boost controller 200 turns the semiconductor device 130 on, current and/or energy accumulates in the inductor 42 as shown in FIG. 6. On the other hand, when the signal applied from the boost controller 200 of the semiconductor device 130 to the gate electrode of the MOSFET 300 is turned off, the MOSFET 300 is also turned off, so that a load of "2" is formed, as shown in FIG. 7. In other words, when the boost controller 200 turns the semiconductor device 130 on, the current and/or energy accumulated in the inductor 42 may be discharged to the positive (+) terminal of the RC (output) circuit shown in FIG. 7.

Figure 8:
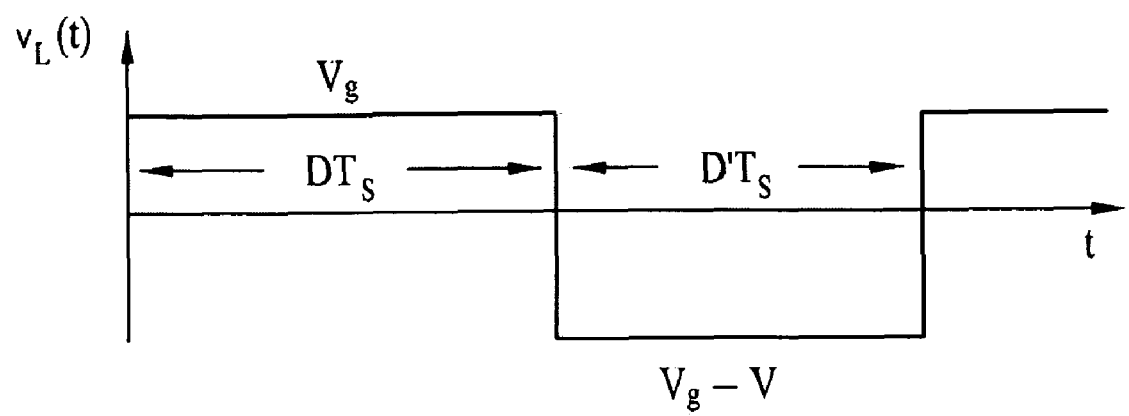
FIG. 8 is an exemplary waveform diagram depicting a voltage generated in an exemplary inductor in accordance with a switching operation of the boost controller.
Figure 9:
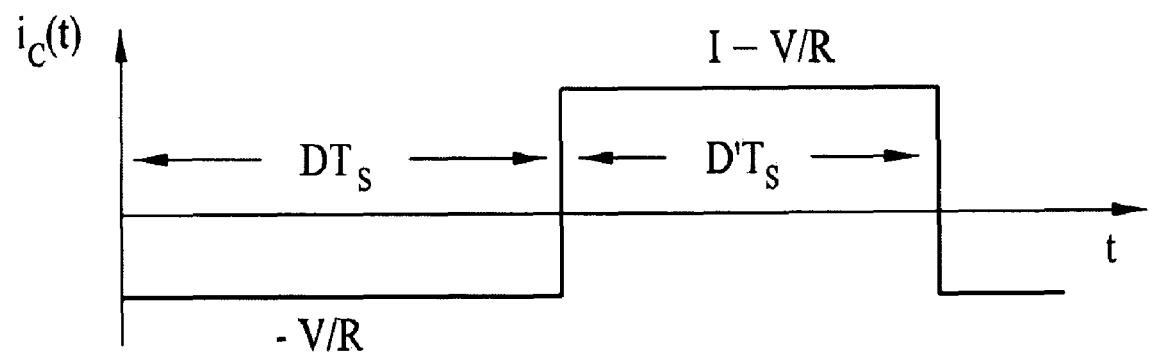
FIG. 9 is a waveform diagram depicting an exemplary current generated in an exemplary inductor in accordance with a switching operation of the exemplary boost controller.

When the load of "1" is formed in the DC-DC transformer circuit 100 in the ON state of the MOSFET 300, as shown in FIG. 6, current supplied from the power source 40 to the circuit is accumulated in the inductor (L). The voltage $V_L(t)$ generated from (or in and/or by) the inductor 42 and the current $i_C(t)$ generated or flowing from (and/or stored in) the capacitor 46 are varied in accordance with the ON/OFF state of the MOSFET 300 as shown in FIGS. 8 and 9. The voltage $V_L(t)$ from the inductor 42 and the current $i_C(t)$ from (or to) the capacitor 46 in the ON state of the MOSFET 300, as shown in FIG. 6, can be expressed by the following Expressions 1 and 2.

$$v_L = V_g \qquad \text{[Expression 1]}$$

$$i_C = \frac{-v}{R} \qquad \text{[Expression 2]}$$

where the values represented by capital letters generally do not vary with respect to variations in time, and the values represented by small letters generally vary with variations in time. That is, "$v_L$" represents "$v_L(t)$", and "$i_C$" represents "$i_C(t)$".

In this case, the ripple voltage $V_L$ and ripple current $i_C$ can be approximately expressed by the following Expressions 3 and 4.

$$v_L = V_g \qquad \text{[Expression 3]}$$

$$i_C = \frac{-V}{R} \qquad \text{[Expression 4]}$$

where the voltage V represents an average voltage across the resistor R, namely, the voltage of the DC components at the output of the DC-DC transformer circuit.

When the load of "2" is formed in the DC-DC transformer circuit 100 as the MOSFET 300 is turned off, as shown in FIG. 7, the current $i_L$ accumulated in the inductor (L) is discharged, so that it is added to the current $i_C$ at the output stage of the DC-DC transformer circuit. The voltage $V_L$ generated from the inductor 42 and the current $i_C$ from the capacitor 46 in this state can be expressed by the following Expressions 5 and 6.

$$v_L = V_g - v \qquad \text{[Expression 5]}$$

$$i_C = i_L \frac{-v}{R} \qquad \text{[Expression 6]}$$

In this case, the ripple voltage and ripple current can be approximately expressed by the following Expressions 7 and 8. In Expressions 7 and 8, the current I represents an average current across a resistor R, namely, a current of or in the DC components at the output of the DC-DC transformer circuit.

$$v_L = V_g - V \qquad \text{[Expression 7]}$$

$$i_C = I - \frac{V}{R} \qquad \text{[Expression 8]}$$

The voltage from the inductor 42 for one switching period, as shown in FIG. 8, can be expressed by the following Expression 9. When there is no current variation for a given period (or after a number of successive periods of no current), the voltage can be expressed by the following Expression 10 because the value of the current is zero.

$$\int_0^{T_s} v_L(t)\,dt = (V_g)DT_s + (V_g - V)D'T_s \qquad \text{[Expression 9]}$$

$$V_g(D+D') - VD' = 0 \qquad \text{[Expression 10]}$$

where, "D" represents the amount of time for which the switch (MOSFET) is in an ON state within one period, and "D'" represents the amount of time for which the switch (MOSFET) is in an OFF state within one period. The ON and OFF times are repeated at constant intervals, generally periodically (e.g., at a constant rate corresponding to a period of the periodic signal provided by the oscillator). This period corresponds to "$T_s$."

The DC component V of the voltage across the resistor R can be expressed by the following Expression 11. Accordingly, the ratio M(D) of the output voltage V to the input voltage Vg depends on the ON/OFF time rate of the switch (MOSFET), so that it can be expressed by the following Expression 12.

$$V = \frac{V_g}{D'} \qquad \text{[Expression 11]}$$

$$M(D) = \frac{V}{V_g} = \frac{1}{D'} = \frac{1}{1-D} \qquad \text{[Expression 12]}$$

Figure 10:
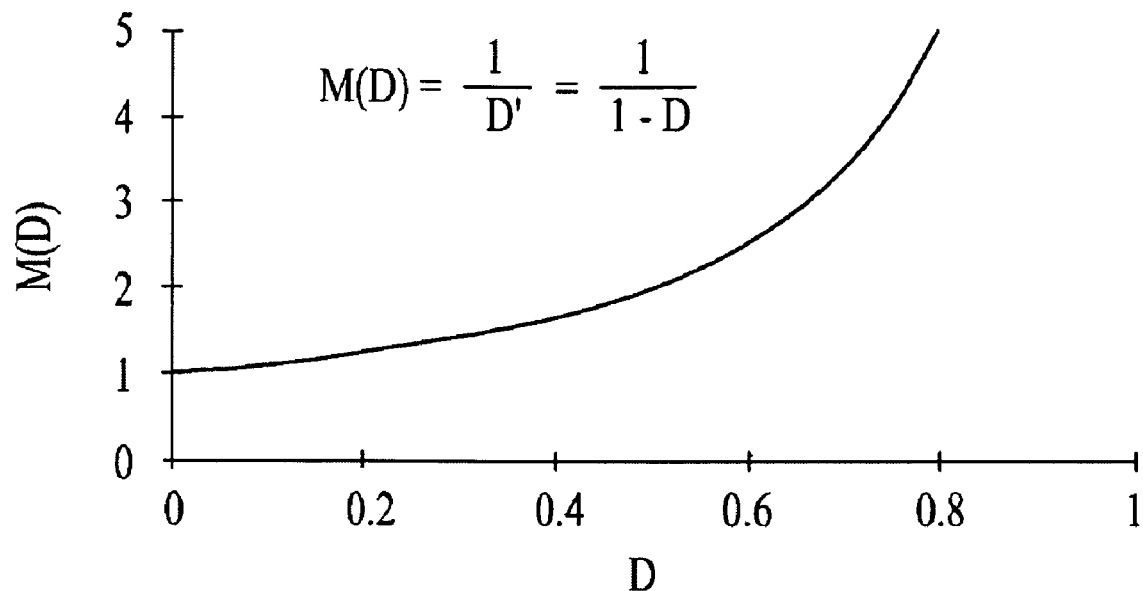
FIG. 10 is a graph depicting an exemplary variation in output voltage according to a switching operation of the exemplary boost controller.

FIG. 10 is a graph depicting a variation in output voltage according to switching operations of the boost controller 200. When the ON time in the switching operation of the MOSFET increases, the output voltage M(D) increases in accordance with the above-described Expressions 9 to 12, as shown in FIG. 10.

Meanwhile, the current generated from the capacitor during one switching period, as shown in FIG. 9, can be expressed by the following Expressions 13 to 16.

$$\int_0^{T_s} i_C(t)\,dt = \left(-\frac{V}{R}\right)DT_s + \left(I - \frac{V}{R}\right)D'T_s \qquad \text{[Expression 13]}$$

$$-\frac{V}{R}(D+D') + ID' = 0 \qquad \text{[Expression 14]}$$

$$I = \frac{V}{D'R} \qquad \text{[Expression 15]}$$

$$I = \frac{V_g}{D'^2 R} \qquad \text{[Expression 16]}$$

When the ON time in the switching operation of the MOSFET increases, the current applied to the output stage increases in accordance with Expressions 13 to 15, similarly to the increase in output voltage.

Figure 11:
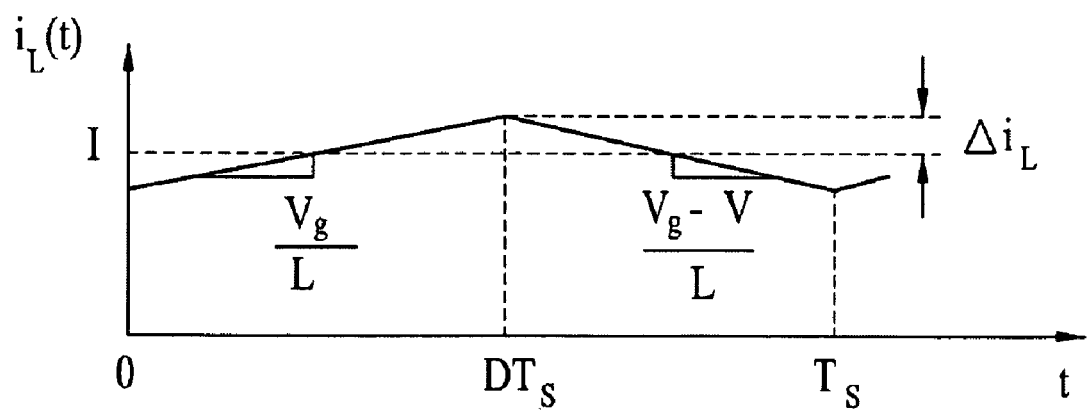
FIG. 11 is a graph depicting an exemplary ripple current generated from the exemplary inductor in accordance with a switching operation of the exemplary boost controller.
Figure 12:
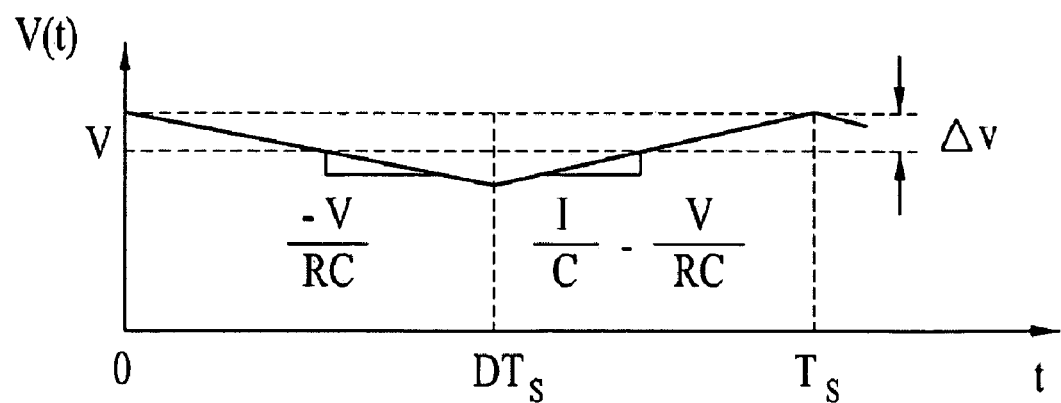
FIG. 12 is a graph depicting an exemplary ripple voltage generated from an exemplary capacitor in accordance with a switching operation of the exemplary boost controller.

FIG. 11 is a graph depicting a ripple current $i_L(t)$ generated from the inductor 42 in accordance with the switching operation(s) of the boost controller 200. FIG. 12 is a graph depicting a ripple voltage V(t) generated from the capacitor 46 in accordance with the switching operation(s) of the boost controller 200. As shown in FIGS. 11 and 12, the ripple current $i_L(t)$ is charged/discharged in/from the inductor 42 in accordance with the ON/OFF state of the MOSFET 300. Similarly, the ripple voltage V(t) is generated, stored, charged and/or discharged in/from the capacitor 46.

Referring to FIG. 11, the ripple current $i_L(t)$ from the inductor 42 during a first period, during which the MOSFET 300 is maintained in an ON state by the boost controller 200, can be expressed by the following Expression 17.

$$\frac{di_L(t)}{dT} = \frac{V_L(t)}{L} = \frac{V_g}{L} \qquad \text{[Expression 17]}$$

Meanwhile, the ripple current $i_L(t)$ from the inductor 42 during a second period, during which the MOSFET 300 is maintained in an OFF state by the boost controller 200, can be expressed by the following Expression 18.

$$\frac{di_L(t)}{dt} = \frac{V_L(t)}{L} = \frac{V_g - V}{L} \qquad \text{[Expression 18]}$$

In this case, the peak value $\Delta i_L$ of the ripple current $i_L$ can be expressed by the following Expression 19.

$$\Delta i_L = \frac{V_g}{2L}DT_s \qquad \text{[Expression 19]}$$

The amount of the current $I_L$ varying during the first period, during which the MOSFET 300 is in an ON state, or during the second period, during which the MOSFET 300 is in an OFF state, can be expressed by the following Expression 20.

$$2\Delta I_L = \frac{V_g}{L}DT_s \qquad \text{[Expression 20]}$$

Referring to FIG. 12, the ripple voltage $v_C(t)$ from the capacitor 46 during the first period, during which the MOSFET 300 is maintained in an ON state by the boost controller 200, can be expressed by the following Expression 21.

$$\frac{dv_C(t)}{dt} = \frac{i_C(t)}{C} = \frac{-V}{RC} \qquad \text{[Expression 21]}$$

Meanwhile, the ripple voltage $v_C(t)$ from the capacitor 46 during the second period, during which the MOSFET 300 is maintained in an OFF state by the boost controller 200, can be expressed by the following Expression 22.

$$\frac{dv_C(t)}{dt} = \frac{i_C(t)}{C} = \frac{I}{C} - \frac{V}{RC} \quad \text{[Expression 22]}$$

In this case, the peak value Δv of the ripple voltage v can be expressed by the following Expression 23.

$$\Delta v = \frac{V}{2RC}DT_s \quad \text{[Expression 23]}$$

The amount of the voltage v varying during the first period, during which the MOSFET 300 is in an ON state, or during the second period, during which the MOSFET 300 is in an OFF state, can be expressed by the following Expression 24.

$$2\Delta v = \frac{-V}{RC}DT_s \quad \text{[Expression 24]}$$

It is possible to control the values of the ripple current and ripple voltage by controlling the switching timing of the MOSFET 300, namely, the ON/OFF time of the MOSFET 300 in accordance with the above-described Expressions 17 to 24. As is apparent from the above description, the values of the ripple current and ripple voltage increase as the ON time in the switching operation of the MOSFET 300 increases.

As described above in detail, the exemplary DC-DC transformer circuit 100 according to the illustrated embodiment(s) of the present invention can obtain a desired output voltage from and/or as compared to an input voltage using the semiconductor device 130, in which the boost controller 200 and MOSFET 300 are on the same substrate. It is also possible to obtain finely-adjusted output values by controlling the values of the ripple current and ripple voltage.

The semiconductor device 130 according to the illustrated embodiment(s) of the present invention reduces the physical space occupied by the semiconductor elements thereof because the semiconductor elements (namely, the boost controller 200 and MOSFET 300) are formed on the same substrate. Accordingly, the overall size of the DC-DC transformer circuit 100 can be reduced. It is also possible to reduce the expense of separate semiconductor elements.

Figure 13A:
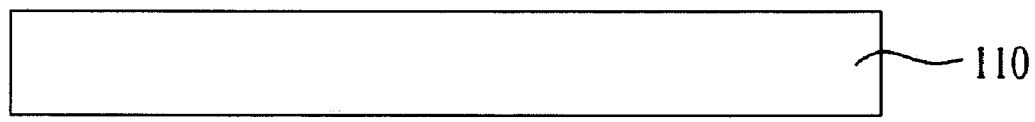
FIGS. 13A to 13O are cross-sectional views illustrating sequential processes of an exemplary method for fabricating the exemplary semiconductor device according to illustrated embodiment(s) of the present invention.
Figure 13B:
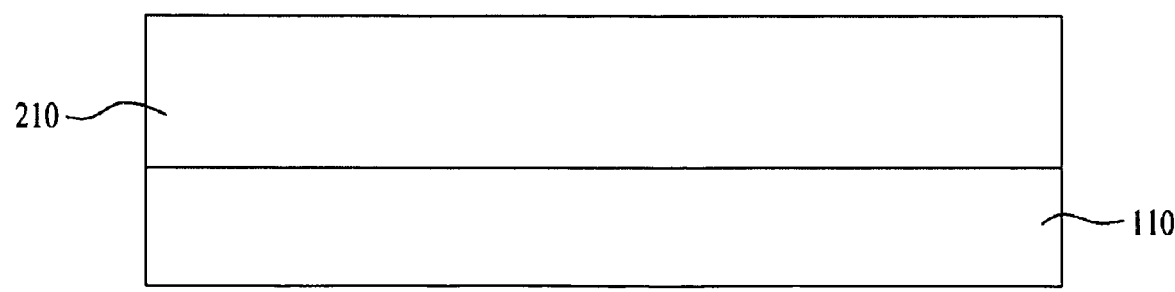
Figure 13C:
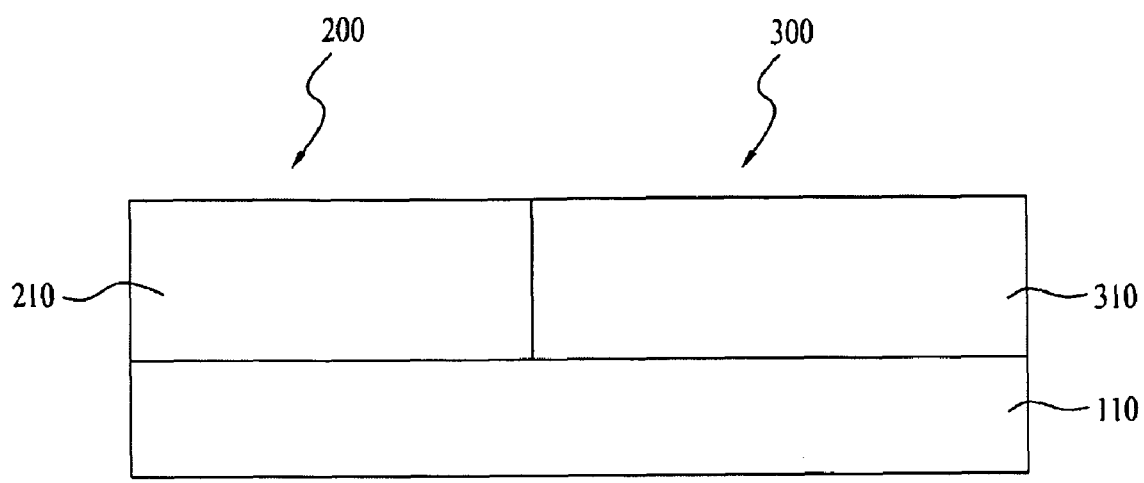
Figure 13D:
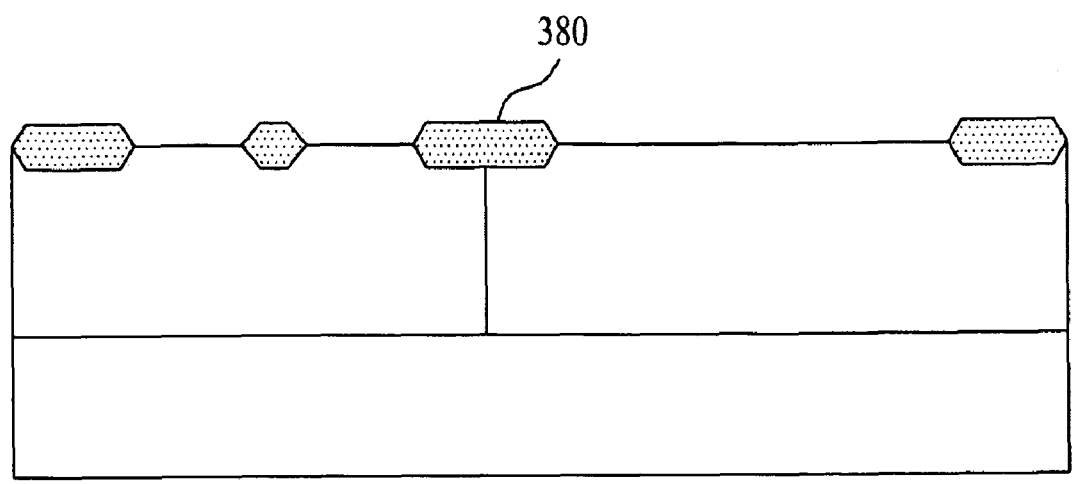
Figure 13E:
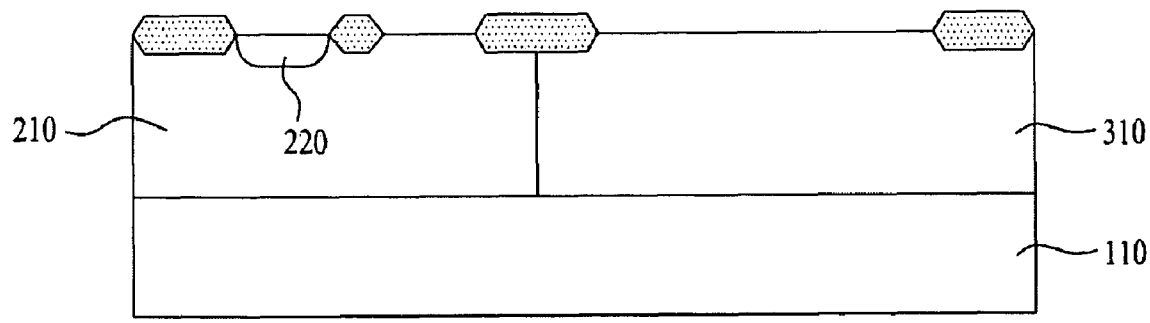
Figure 13F:
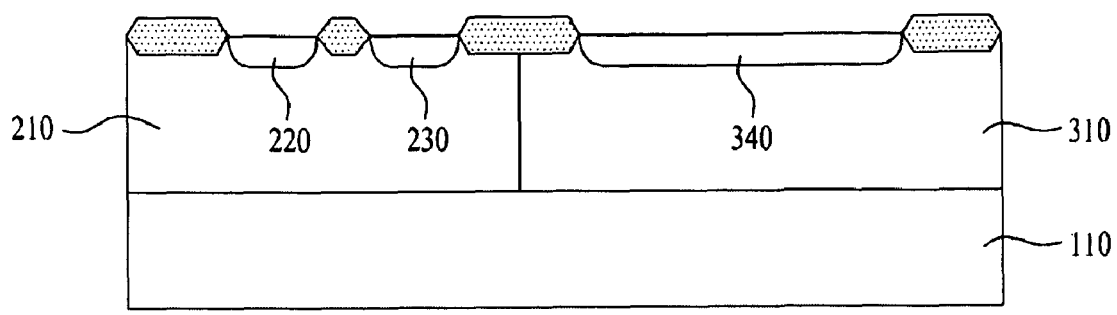
Figure 13G:
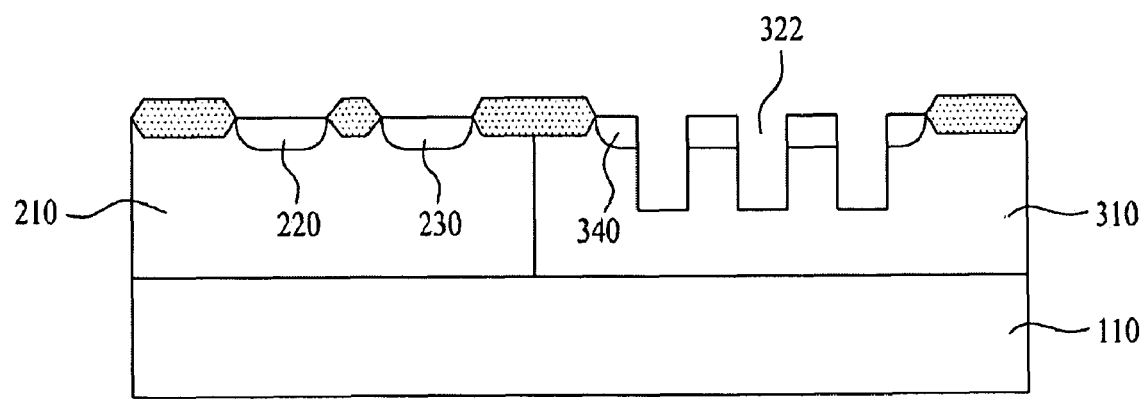
Figure 13H:
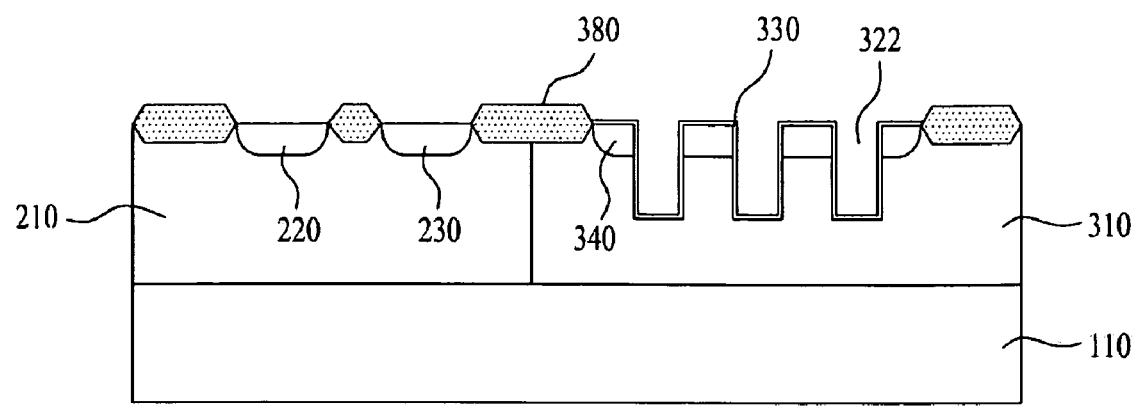
Figure 13I:
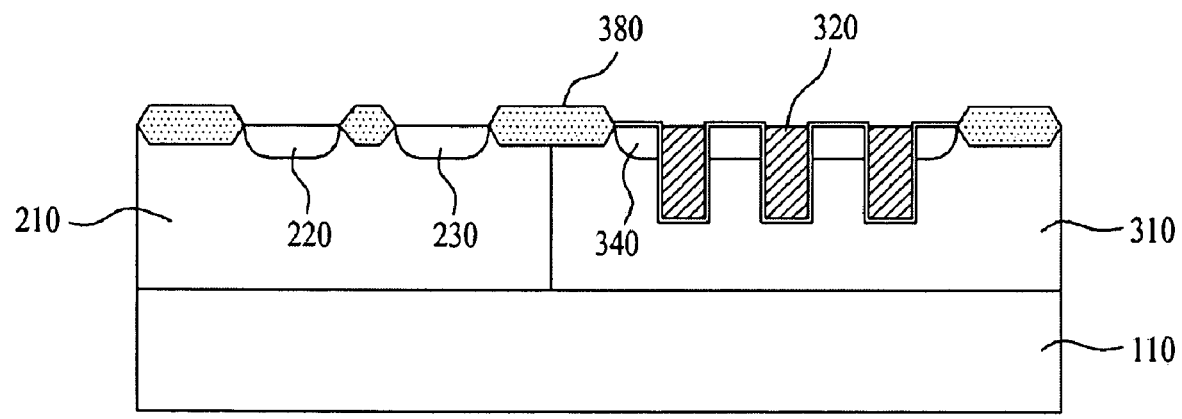
Figure 13J:
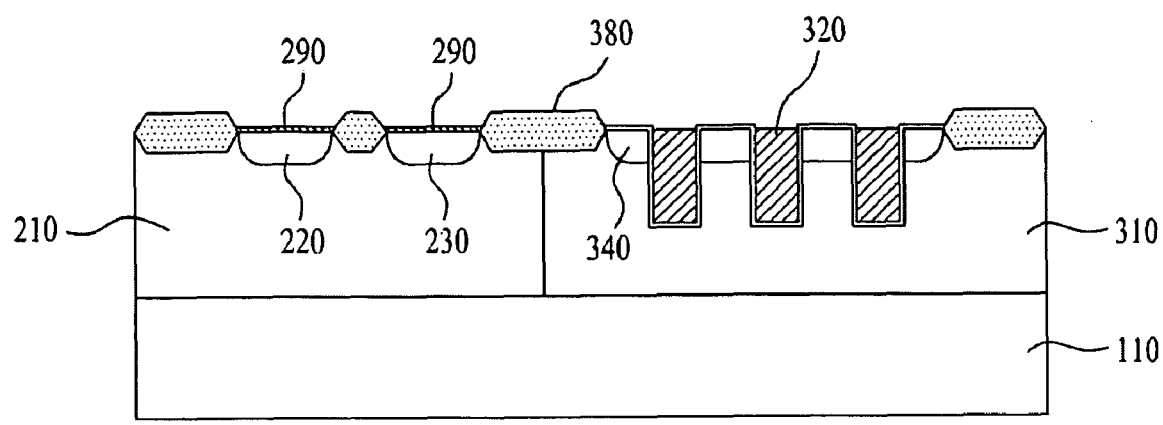
Figure 13K:
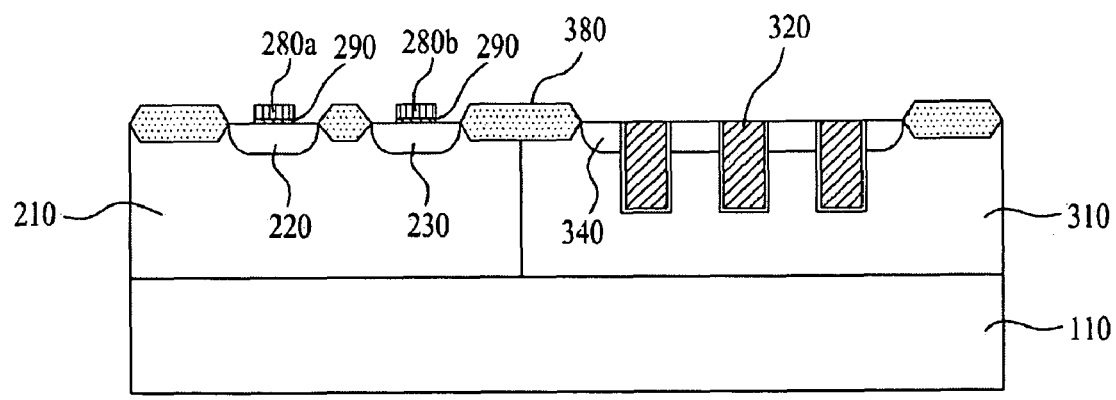
Figure 13L:
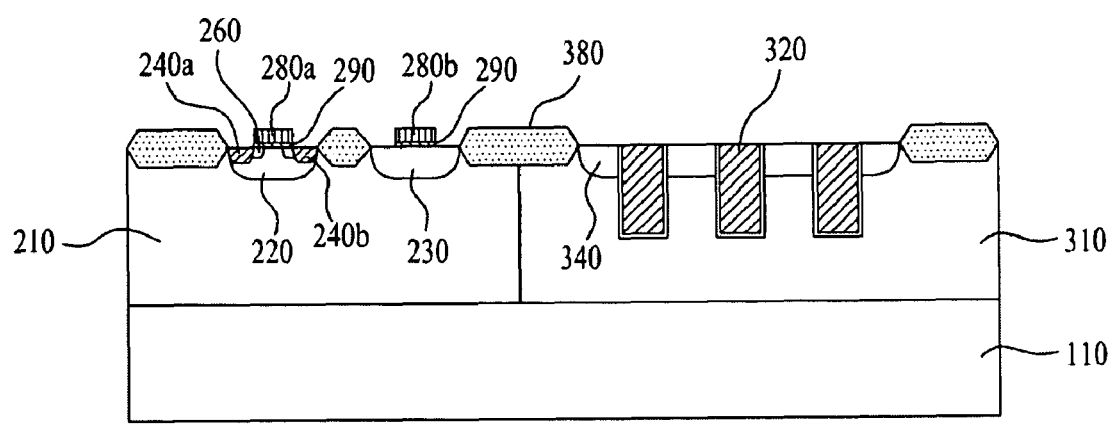
Figure 13M:
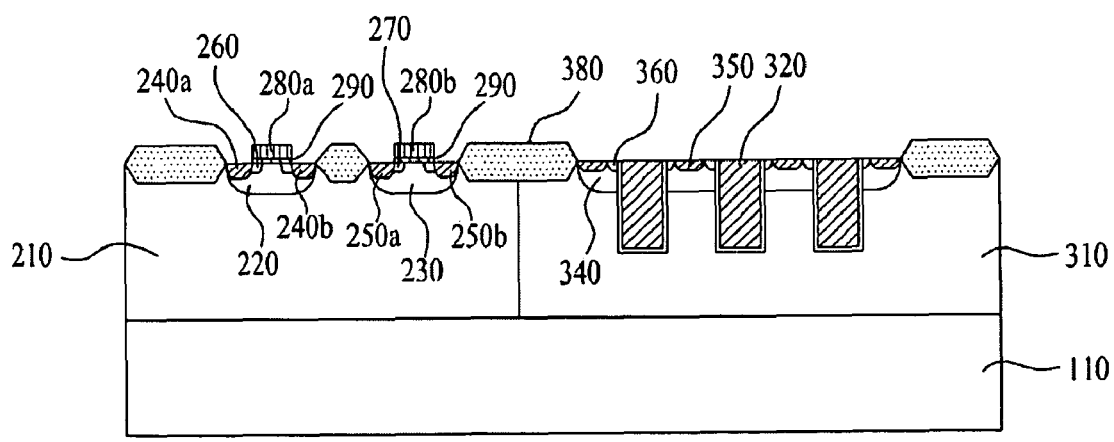
Figure 13N:
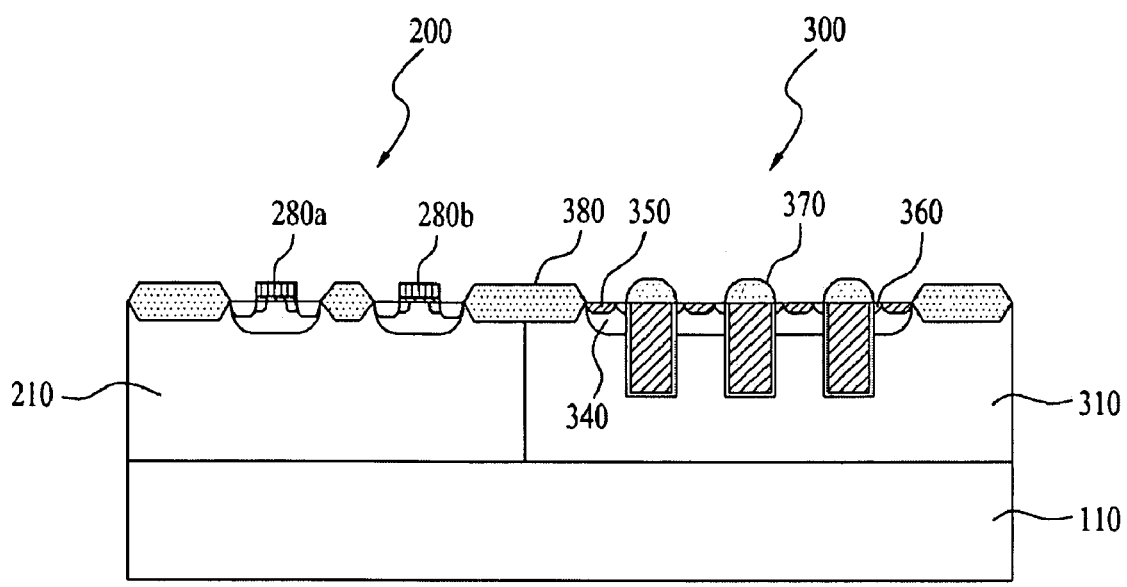
Figure 13O:
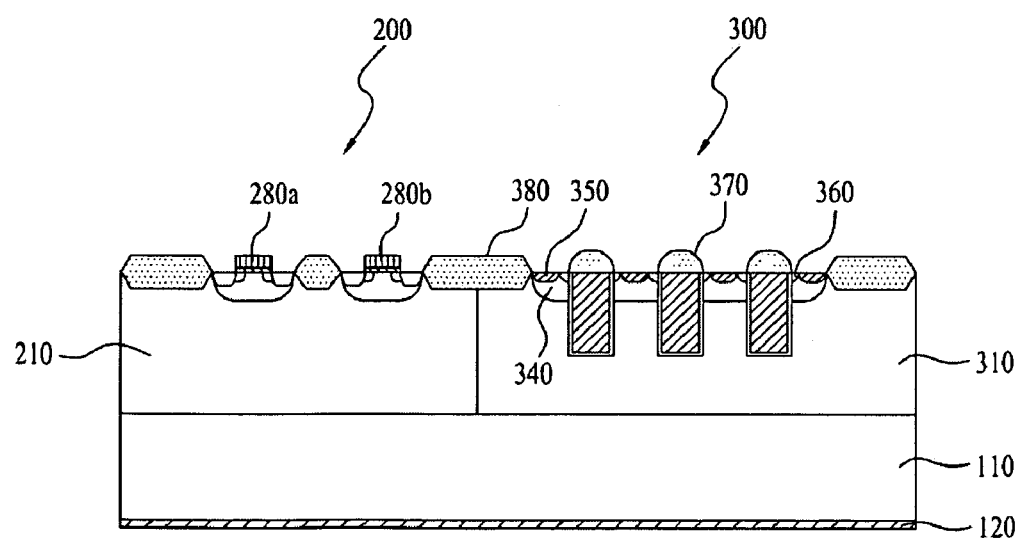

FIGS. 13A to 13O are cross-sectional views illustrating sequential processes in an exemplary method for fabricating a semiconductor device according to the illustrated embodiment(s) of the present invention.

As described above, the exemplary semiconductor device 130 according to the illustrated embodiment(s) of the present invention has a structure in which the boost controller 200 and trench MOSFET 300 are formed on the same substrate. Hereinafter, an exemplary method for fabricating the semiconductor device according to the illustrated embodiment(s) of the present invention will be described with reference to FIGS. 13A to 13O.

FIG. 13A shows an N+ type semiconductor substrate 110. For the semiconductor substrate 110, any N+ type semiconductor substrate (e.g., a single crystalline semiconductor substrate or a compound semiconductor substrate, such as GaAs or SiGe) may be used. The following description will be given in conjunction with the case in which a single crystalline silicon (Si) substrate is used.

Thereafter, epitaxial (e.g., single crystalline) silicon (Si) is grown over the N+ type silicon (Si) substrate 110 such that the grown crystalline silicon has a P type, thereby forming the P type epitaxial layer 210 to a thickness of 2.5 to 10 μm, as shown in FIG. 13B.

A Group 5 material such as phosphorus (P) is implanted into a portion of the P type epitaxial layer 210, thereby forming a lightly-doped N type layer 310, as shown in FIG. 13C. As a result, regions are defined where the boost controller 200 will be formed and where the trench MOSFET 300 will be formed. The N type layer 310 may be formed to the same thickness of the P type epitaxial layer 210 (e.g., a thickness of 2.5 to 10 μm), although the thickness or depth of the N-type ion implantation may be greater or less than the thickness of the P type epitaxial layer 210, in accordance with design and/or manufacturing preferences.

As shown in FIG. 13D, the device isolation layer ($SiO_2$) 380 is then formed on the P type epitaxial layer 210 and N type layer 310, to isolate elements such as transistors which will be formed in the regions corresponding to the boost controller 200 and the trench MOSFET 300. In particular, part of the device isolation layer 380 is formed at an interface between the P type epitaxial layer 210 and N type layer 310. The device isolation layer 380 may be formed by local oxidation of silicon (LOCOS) and/or shallow trench isolation (STI).

Thereafter, a Group 5 material such as phosphorus (P) is subsequently implanted into a portion of the P type epitaxial layer 210 to form the N type well 220, as shown in FIG. 13E. Alternatively, another Group 5 atom such as arsenic (As) or antimony (Sb) may be implanted to form the N type well 220.

Subsequently, as shown in FIG. 13F, a Group 3 material such as boron (B) is implanted into another portion of the P type epitaxial layer 210, to form the P type well 230. The N type well 220 and P type well 230 respectively shown in FIGS. 13E and 13F are isolated from each other by the element isolation layer 380. During the formation of the P type well 230 in the P type epitaxial layer 210, the Group 3 material (e.g., boron) may also be implanted into the N type layer 310 to form a heavily-doped P type well 340.

Thereafter, as shown in FIG. 13G, a plurality of trenches 322 are formed in the N type layer 310 to a depth greater than the depth of the P type well 340, such that each trench 322 extends through the P type well 340. The trenches 322 are formed by patterning a photoresist or other mask on the surface to expose the areas of N type layer 310 in which the gates are to be formed, then by dry etching (e.g., reactive ion etching or RIE) the exposed areas to a depth of, for example, 1 to 2 μm. Silicon (Si) will fill the trenches 322 to form gates buried in the trenches 322. Although as few as one trench may be formed, in preferred embodiments, a plurality of trenches (e.g., at least 2 or 3) are formed.

Subsequently, heating the exposed N type layer 310 at a temperature of 800 to 1,100° C. in the presence of an oxygen source (e.g., dioxygen, ozone, nitrous oxide, etc., optionally in the presence of an inert or noble gas such as He or Ar) forms gate oxide film 330, as shown in FIG. 13H. The gate oxide film 330 may have a thickness of 50 to 500 Å.

N type polysilicon (poly-Si) is then deposited into the trenches 322 having the gate oxide film 330 thereon to form N type gates 320 buried in the trenches 322, as shown in FIG. 13I. The silicon may be deposited by chemical vapor deposition (CVD) of a silicon source (such as silane, $SiH_4$), optionally together with a dopant source (e.g., a phosphorous source such as $PH_3$, $PCl_3$ [optionally in the presence of $H_2$], etc.). After deposition of the silicon, it may be crystallized (e.g., by heating to a temperature of 600-800° C. or by irradiating with a laser), and the excess silicon may be removed by etchback (e.g., dry etching of the silicon) or chemical mechanical polishing.

Thereafter, as shown in FIG. 13J, gate oxide films ($SiO_2$) 290 are respectively formed on the N type well 220 and P type well 230 on the P type epitaxial layer 210.

Subsequently, a polysilicon (poly-Si) layer is formed on the gate oxide films 290, and then patterned and etched such that only the gate electrodes 280a and 280b are left. Before etching the polysilicon layer, a P type material may be implanted into the polysilicon layer on the N type well 220. Also, an N type material may be implanted into the polysilicon layer on the P type well 230. Thereafter, an annealing process may be carried out to heat and sufficiently diffuse the implanted P and N type materials, and then to cool the P and N type materials. Thus, a gate 280a of the P type MOS (PMOS) transistor and a gate 280b of the N type MOS (NMOS) transistor are formed, as shown in FIG. 13K. Alternatively, the process of implanting and/or diffusing dopant in the gates 280a and 280b may be conducted simultaneously with formation of the source/drain terminals in the boost controller region 200 (see below).

Thereafter, P type source and drain terminals 240a and 240b are formed in the N type well 220 of the PMOS transistor region at opposite sides of the gate 280a, as shown in FIG. 13L. In this case, a P type LDD region 260 may be formed in contact with the source and drain terminals 240a and 240b of the N type well 220. The LDD region 260 may be formed by tilted ion implantation, or alternatively, the LDD region 260 may be implanted or otherwise formed first, then sidewall spacers (not shown) can be formed at sides of the gate 280a, then P type source and drain terminals 240a and 240b implanted or otherwise formed thereafter.

N type source and drain terminals 250a and 250b are then formed in the P type well 230 of the NMOS transistor region at opposite sides of the gate 280b, as shown in FIG. 13M. In this case, an N type LDD region 270 may be formed in contact with the source and drain terminals 250a and 250b of the P type well 230. Also, heavily-doped $N^+$ type source terminals 360 may be formed simultaneously in the P type well 340 in the N type layer 310 such that each $N^+$ type source 360 is between the adjacent gates 320 or between an outermost gate and an isolation layer structure 380. N type contact layers 350 are then formed (e.g., by masked or patterned ion implantation) in contact with respective sources 360. Alternatively, N type source and drain terminals 250a and 250b and heavily-doped $N^+$ type source terminals 360 (and, optionally, N type contact layers 350) may be formed before P type source and drain terminals 240a and 240b.

Thereafter, an insulating layer 370 is formed over the gates 320 arranged in the region of the NMOSFET 300, as shown in FIG. 13N. The insulating layer 370 may be formed by thermal oxidation of the silicon gates 320 (after masking or otherwise covering other exposed regions of silicon), or more preferably, by depositing and patterning an oxide (e.g., silicon dioxide) and/or (e.g., silicon nitride) on/over the gates 320. Contacts may be made to the gates 320 by selectively etching a portion of the insulating layer 370 over the gates 320.

A natural or native oxide film is then removed from the back surface of the heavily-doped $N^+$ silicon (Si) substrate 110, using a dry or wet etching method. Subsequently, a conductive metal material (for example, a conductive metal such as silver [Ag], copper [Cu] and/or aluminum [Al]) is coated over the back surface of the substrate 110, to form a common drain 120 for the multiple gates 320 and multiple sources 360, as shown in FIG. 13O.

In accordance with the above-described fabrication method, the boost controller 200, which may include a PMOSFET and an NMOSFET, and the trench NMOSFET 300 can be formed on the same substrate, namely, the substrate 110, as shown in FIG. 3.

In accordance with the above-described semiconductor device of the present invention, the above-described fabrication method thereof, and the above-described transformer circuit using the same, the physical space consumed is reduced because the boost controller 200 and N type MOSFET 300 are formed on the same substrate, namely, the substrate 110. Accordingly, the overall size of the DC-DC transformer circuit can be reduced. Since the elements of the semiconductor device are fabricated by a single process (e.g., differently from the conventional case, in which the elements are fabricated using separate fabrication processes), it is possible to achieve an enhancement in the fabrication efficiency of the semiconductor device and a reduction in the fabrication costs of the semiconductor device.

The DC-DC transformer circuit, which uses the semiconductor device according to the embodiment of the present invention, can obtain a desired output voltage from or as compared to an input voltage, using the semiconductor device, in which the boost controller and MOSFET are formed on the same substrate. It is also possible to obtain finely-adjusted output values by controlling the values of the ripple current and ripple voltage using the ON-Off switching operations of the boost controller. The semiconductor device according to the embodiment of the present invention can also secure desired operation stability according to variations in temperature.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor device comprising:
   a trench metal oxide semiconductor (MOS) transistor adapted to provide a current load from a power source; and
   a boost controller adapted or configured to control the trench MOS transistor, the boost controller being a single semiconductor device with the trench MOS transistor to form an integrated structure, wherein the boost controller comprises:
      a lightly-doped P type epitaxial layer on the semiconductor substrate;
      an N type well and a first P type well having a predetermined depth in the P type epitaxial layer;
      an oxide film on each of the N type well and the P type well;
      P and N type polysilicon gates on the oxide film, respectively;
      P type source and drain electrodes in regions at opposite sides of the gate in the N type well;
      N type source and drain electrodes in regions at opposite sides of the gate in the P type well;
      a common drain on a back surface of the heavily-doped N+ type semiconductor substrate; and
      a device isolation layer adapted or configured to isolate the boost controller from the trench MOS transistor.

2. The semiconductor device according to claim 1, wherein the trench MOS transistor comprises:
   a heavily-doped N+ type semiconductor substrate;

a lightly-doped N type layer on or in the heavily-doped N+ type semiconductor substrate;

a second P type well having a predetermined depth in the lightly-doped N type layer;

a gate in a trench in the lightly-doped N type layer extending through the second P type well;

N type sources adjacent to the gate;

a contact layer in contact with the N type sources;

an insulating layer covering the gate; and the common drain on the back surface of the heavily-doped N+ type semiconductor substrate.

3. The semiconductor device according to claim 2, wherein the trench MOS transistor further comprises:

a silicon oxide film between the gate and an inner wall of the trench.

4. The semiconductor device according to claim 3, wherein the silicon oxide film has a thickness of 50 to 500 Å.

5. The semiconductor device according to claim 2, wherein the trench has a depth of 1 to 2 μm.

6. The semiconductor device according to claim 2, wherein the trench MOS transistor comprises:

a plurality of gates in a corresponding plurality of trenches.

7. The semiconductor device according to claim 1, wherein the lightly-doped P type epitaxial layer has a thickness of 2.5 to 10 μm.

8. The semiconductor device according to claim 1, wherein the trench MOS transistor concentrically surrounds the boost controller.

9. The semiconductor device according to claim 1, wherein the common drain on the back surface of the heavily-doped N+ type semiconductor substrate comprises silver, copper or aluminum.

10. A transformer circuit, comprising:

a power source supplying a power;

an inductor adapted or configured to accumulate and discharge current;

a capacitor adapted or configured to charge, store and discharge energy from the inductor;

a diode adapted or configured to prevent a flow of current from the capacitor to the inductor; and a semiconductor device adapted or configured to control a current load from the power source, energy accumulation, or discharge of the inductor, wherein the semiconductor device comprises:

a trench metal oxide semiconductor (MOS) transistor adapted or configured to switch the current load from the power source; and a boost controller adapted or configured to control turning the trench MOS transistor on and off, the boost controller being a single semiconductor device with the trench MOS transistor to form an integrated structure, wherein the boost controller comprises:

a lightly-doped P type epitaxial layer on the semiconductor substrate;

an N type well and a P type well having a predetermined depth in the P type epitaxial layer;

an oxide film on each of the N type well and the P type well;

P and N type polysilicon gates on the oxide film, respectively;

P type source and drain electrodes in regions at opposite sides of the gate in the N type well;

N type source and drain electrodes in regions at opposite sides of the gate in the P type well;

a common drain on a back surface of the heavily-doped N+ type semiconductor substrate; and a device isolation layer adapted or configured to isolate the boost controller from the trench MOS transistor.

11. The transformer circuit according to claim 10, wherein the transformer circuit controls the current load from the power source, through the semiconductor device, to output a voltage equal to or higher than a voltage from the power source.

12. The transformer circuit according to claim 10, further comprising:

a temperature sensor adapted or configured to detect a temperature or amount of heat from the semiconductor device, and thereby control an operation of the semiconductor device.

13. The transformer circuit according to claim 10, wherein the inductor is coupled to the power source.

14. The transformer circuit according to claim 10, wherein the lightly-doped P type epitaxial layer has a thickness of 2.5 to 10 μm.

15. The transformer circuit according to claim 10, wherein the common drain on the back surface of the heavily-doped N+ type semiconductor substrate comprises silver, copper or aluminum.

16. The transformer circuit according to claim 10, wherein the trench MOS transistor comprises:

a heavily-doped N+ type semiconductor substrate;

a lightly-doped N type layer on or in the heavily-doped N+ type semiconductor substrate;

a P type well having a predetermined depth in the lightly-doped N type layer;

a gate in a trench in the lightly-doped N type layer extending through the P type well;

N type sources adjacent to the gate;

a contact layer in contact with the sources;

an insulating layer covering the gates; and the common drain on the back surface of the heavily-doped N+ type semiconductor substrate.

17. The transformer circuit according to claim 16, wherein the trench MOS transistor further comprises:

a silicon oxide film between the gate and an inner wall of the trench, wherein the silicon oxide film has a thickness of 50 to 500 Å.

18. The transformer circuit according to claim 16, wherein the trench MOS transistor comprises:

a plurality of gates in a corresponding plurality of trenches.

19. The transformer circuit according to claim 18, wherein the trench MOS transistor concentrically surrounds the boost controller.

20. The transformer circuit according to claim 18, wherein each of the trenches has a depth of 1 to 2 μm.

* * * * *